(12) United States Patent
Otake

(10) Patent No.: US 8,314,458 B2
(45) Date of Patent: Nov. 20, 2012

(54) SEMICONDUCTOR DEVICE AND METHOD OF MANUFACTURING THE SAME

(75) Inventor: Seiji Otake, Kumagaya (JP)

(73) Assignees: SANYO Semiconductor Co., Ltd., Gunma (JP); Semiconductor Components Industries, LLC, Phoenix, AZ (US)

(*) Notice: Subject to any disclaimer, the term of this patent is extended or adjusted under 35 U.S.C. 154(b) by 343 days.

(21) Appl. No.: 12/707,734

(22) Filed: Feb. 18, 2010

(65) Prior Publication Data

US 2010/0207197 A1 Aug. 19, 2010

(30) Foreign Application Priority Data

Feb. 18, 2009 (JP) ................................ 2009-035645

(51) Int. Cl.
*H01L 29/66* (2006.01)
(52) U.S. Cl. ........ 257/328; 257/324; 257/325; 257/326; 257/E29.256
(58) Field of Classification Search .......... 257/324–328, 257/288, E29.256, E21.417, 139; 438/286, 438/308
See application file for complete search history.

(56) References Cited

U.S. PATENT DOCUMENTS

| | | | | |
|---|---|---|---|---|
| 5,202,907 A * | 4/1993 | Yonemoto | ........................ | 377/60 |
| 5,517,046 A * | 5/1996 | Hsing et al. | .................... | 257/336 |
| 5,756,387 A * | 5/1998 | Villa et al. | ...................... | 438/328 |
| 5,925,910 A * | 7/1999 | Menegoli | ........................ | 257/335 |
| 6,027,955 A * | 2/2000 | Lee et al. | .......................... | 438/57 |
| 6,133,107 A * | 10/2000 | Menegoli | ........................ | 438/306 |
| 6,278,156 B1 * | 8/2001 | Kobayashi | ..................... | 257/347 |
| 6,365,932 B1 * | 4/2002 | Kouno et al. | .................. | 257/341 |
| 6,555,883 B1 * | 4/2003 | Disney et al. | ................... | 257/401 |
| 6,580,131 B2 * | 6/2003 | Huang et al. | ................... | 257/355 |
| 6,593,621 B2 * | 7/2003 | Tsuchiko et al. | .............. | 257/335 |
| 6,873,017 B2 * | 3/2005 | Cai et al. | ........................ | 257/355 |
| 6,894,350 B2 * | 5/2005 | Shimizu et al. | ................ | 257/343 |
| 6,909,143 B2 * | 6/2005 | Jeon et al. | ....................... | 257/335 |
| 6,927,452 B2 * | 8/2005 | Shin et al. | ....................... | 257/335 |
| 7,145,206 B2 * | 12/2006 | Mallikarjunaswamy | ..... | 257/370 |
| 7,202,114 B2 * | 4/2007 | Salcedo et al. | ................ | 438/133 |
| 7,288,816 B2 * | 10/2007 | Kanda et al. | ................... | 257/343 |
| 7,368,786 B2 * | 5/2008 | Xu et al. | ......................... | 257/343 |
| 7,417,282 B2 * | 8/2008 | Jang et al. | ....................... | 257/328 |
| 7,439,584 B2 * | 10/2008 | Khemka et al. | ................ | 257/341 |
| 7,495,286 B2 * | 2/2009 | Lee | ................................ | 257/340 |
| 7,554,159 B2 * | 6/2009 | Ker et al. | ........................ | 257/360 |
| 7,732,869 B2 * | 6/2010 | Noguchi et al. | ............... | 257/355 |
| 7,781,826 B2 * | 8/2010 | Mallikararjunaswamy et al. | ............................. | 257/328 |

(Continued)

FOREIGN PATENT DOCUMENTS

JP 2003-303961 10/2003

*Primary Examiner* — N Drew Richards
*Assistant Examiner* — Ankush Singal
(74) *Attorney, Agent, or Firm* — Morrison & Foerster LLP

(57) ABSTRACT

In the semiconductor device according to the present invention, a P type diffusion layer and an N type diffusion layer as a drain lead region are formed on an N type diffusion layer as a drain region. The P type diffusion layer is disposed between a source region and the drain region of the MOS transistor. When a positive ESD surge is applied to a drain electrode, causing an on-current of a parasite transistor to flow, this structure allows the on-current of the parasite transistor to take a path flowing through a deep portion of an epitaxial layer. Thus, the heat breakdown of the MOS transistor is prevented.

6 Claims, 7 Drawing Sheets

U.S. PATENT DOCUMENTS

| | | | |
|---|---|---|---|
| 7,781,834 B2 * | 8/2010 | Wei et al. | 257/343 |
| 7,786,507 B2 * | 8/2010 | Denison et al. | 257/173 |
| 7,875,929 B2 * | 1/2011 | Ko | 257/342 |
| 7,906,811 B2 * | 3/2011 | Otake | 257/355 |
| 7,910,951 B2 * | 3/2011 | Vashchenko | 257/175 |
| 2002/0045301 A1 * | 4/2002 | Sicard et al. | 438/197 |
| 2002/0159208 A1 * | 10/2002 | Ker et al. | 361/56 |
| 2004/0227190 A1 * | 11/2004 | Cai et al. | 257/365 |
| 2006/0068552 A1 * | 3/2006 | Ogura | 438/279 |
| 2006/0071273 A1 * | 4/2006 | Hiroki | 257/343 |
| 2006/0076612 A1 * | 4/2006 | Otake et al. | 257/324 |
| 2006/0118814 A1 * | 6/2006 | Cai et al. | 257/139 |
| 2006/0131645 A1 * | 6/2006 | Kaneko | 257/330 |
| 2006/0220099 A1 * | 10/2006 | Kikuchi et al. | 257/315 |
| 2006/0220115 A1 * | 10/2006 | Otake | 257/335 |
| 2007/0221969 A1 * | 9/2007 | Nakaya | 257/288 |
| 2007/0246738 A1 * | 10/2007 | Otake | 257/139 |
| 2007/0246739 A1 * | 10/2007 | Otake | 257/139 |
| 2007/0272942 A1 * | 11/2007 | Otake | 257/139 |
| 2008/0001229 A1 * | 1/2008 | Watanabe et al. | 257/360 |
| 2008/0006875 A1 * | 1/2008 | Ohtsuka et al. | 257/341 |
| 2009/0315113 A1 * | 12/2009 | Vashchenko | 257/355 |
| 2010/0244152 A1 * | 9/2010 | Bahl et al. | 257/408 |

* cited by examiner

Prior Art

SEMICONDUCTOR DEVICE AND METHOD OF MANUFACTURING THE SAME

This application claims priority from Japanese Patent Application Number JP2009-035645 filed on Feb. 18, 2009, the content of which is incorporated herein by reference in its entirety.

BACKGROUND OF THE INVENTION

1. Field of the Invention

The present invention relates to a semiconductor device which prevents a breakdown due to overvoltage such as electrostatic discharge (hereinafter, referred to as ESD), and a method of manufacturing the same.

2. Description of the Related Art

As a structural embodiment of a conventional semiconductor device, MOS transistor 31 described below is known.

As shown in FIG. 8, N type epitaxial layer 33 is formed on P type semiconductor substrate 32. In the epitaxial layer 33, P type diffusion layers 34 and 35 are formed as a backgate region. In the P type diffusion layer 34, N type diffusion layer 36 is formed as a source region. In the epitaxial layer 33, N type diffusion layers 37 and 38 are formed as a drain region. On the epitaxial layer 33, gate oxide film 39, gate electrode 40 and insulating layer 41 are formed (for example, see Japanese Patent Application Publication No. 2003-303961 (pages 3 and 4, FIGS. 1 and 2)).

The MOS transistor 31 includes parasitic transistor Tr2 (hereinafter, referred to as parasite Tr2) formed of the N type diffusion layers 37 and 38 (including the epitaxial layer 33), P type diffusion layers 34 and 35, and N type diffusion layer 36. When a positive ESD surge, for example, is applied to drain electrode 42 of the MOS transistor 31, on-current I2 of the parasite Tr2 occurs as shown in a dotted line in FIG. 8, and the parasite Tr2 is thus turned on. At this time, the on-current I2 of the parasite Tr2 flowing from the drain electrode 42 flows through a portion in the epitaxial layer 33 near its top surface (called the top surface portion of the epitaxial layer 33 below) having small resistance value. Accordingly, the on-current I2 of the parasite Tr2 is concentrated in a region indicated by circle 43 of FIG. 8. Since the gate oxide film 39, the insulating film 41, and the like which are inferior in heat radiating property compared to silicon are disposed on the epitaxial layer 33, the top surface portion of the epitaxial layer 33 is a region poor in heat radiation property. Accordingly, in the region represented by the circle 43, heat is generated by the on-current I2 of the parasite Tr2, leading to a problem that a breakdown occurs at the top surface portion of the epitaxial layer 33. For example, when an electrostatic breakdown experiment was performed on the MOS transistor 31 having a structure with a gate length (W) of 1000 μm, the above described heat breakdown occurred with the on-current I2 of the parasite Tr2 of 1 A or smaller. The MOS transistor 31 having the above structure had an ESD withstand voltage of 200V or smaller in a machine model (MM) and an ESD withstand voltage of 1000V or smaller in a human body model (HBM). Accordingly, a desired ESD robustness cannot be achieved in this structure.

SUMMARY OF THE INVENTION

The invention provides a semiconductor transistor device that includes a semiconductor layer of a first general conductivity type, and a drain diffusion layer of the first general conductivity type formed in the semiconductor layer. The drain diffusion layer includes a drain contact region configured to receive a drain potential from a device external to the transistor device or supply a drain potential to a device external to the transistor device. The device also includes a backgate diffusion layer of a second general conductivity type formed in the semiconductor layer, a source diffusion layer of the first general conductivity type formed in the backgate diffusion layer, and an additional diffusion layer of the second general conductivity type formed in the drain diffusion layer so that at least part of the additional diffusion layer is disposed between the backgate diffusion layer and the drain contact region.

The invention also provides a method of manufacturing a semiconductor device. The method includes, in a semiconductor layer, forming a drain diffusion layer of a first general conductivity type, a backgate diffusion layer of a second general conductivity type and a source diffusion layer of the first general conductivity type. The method also includes forming a gate electrode on the semiconductor layer, forming an additional diffusion layer of the second general conductivity type in the drain diffusion layer using the gate electrode as a part of a mask, and after the formation of the additional diffusion layer, forming an insulating spacer film on a side wall of the gate electrode.

DESCRIPTION OF THE INVENTION

Figure 1A:
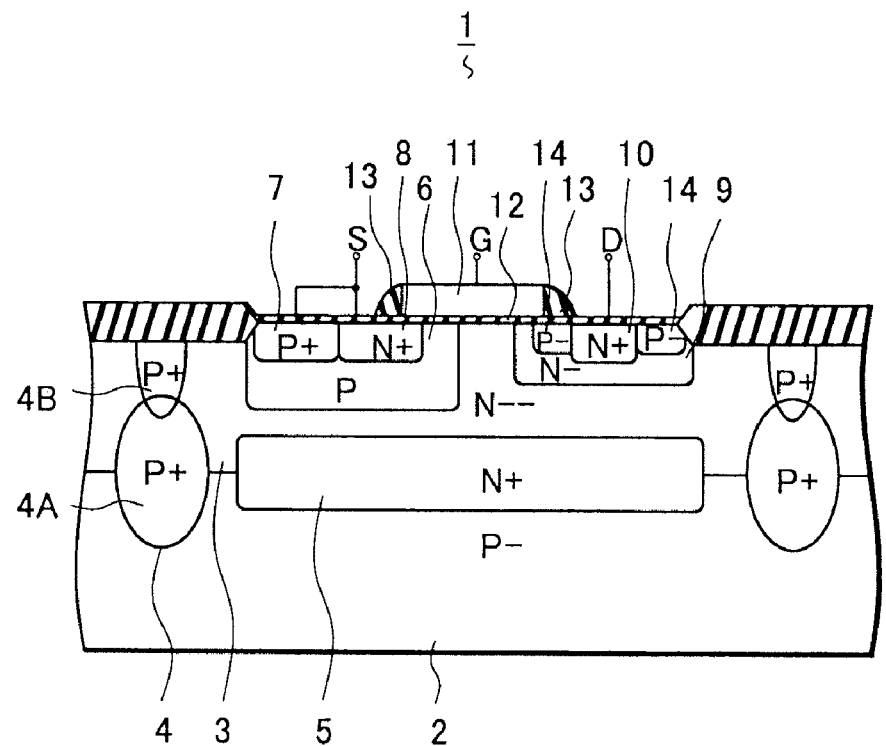
FIG. 1A and FIG. 1B are cross-sectional views illustrating a semiconductor device according to an embodiment of the present invention.
Figure 1B:
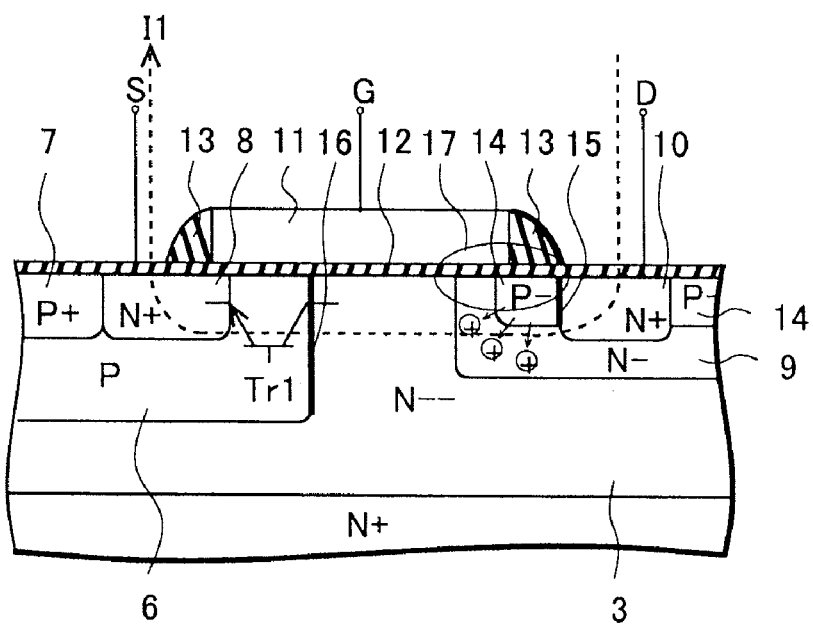
Figure 2A:
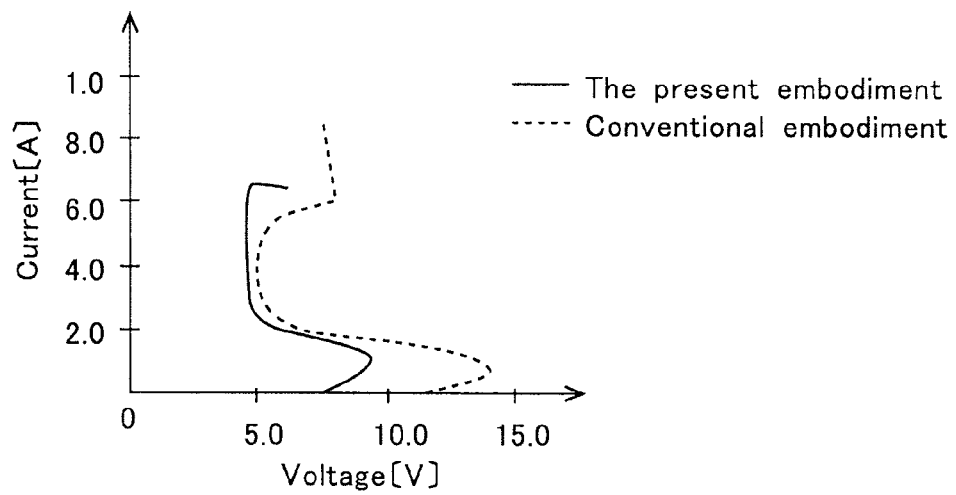
FIGS. 2A-2C are graphs showing characteristics of the semiconductor device according to the embodiment of the present invention.
Figure 2B:
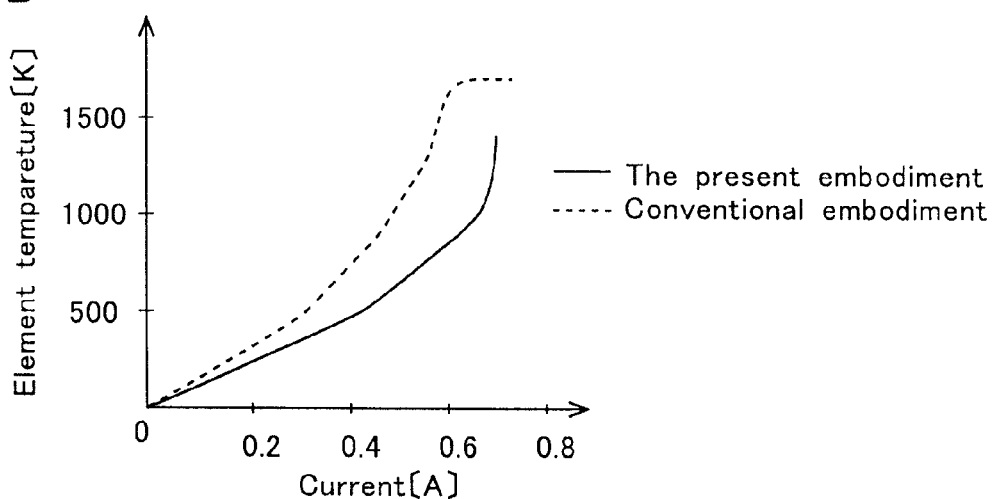

Hereinbelow, a semiconductor device according to a first embodiment of the present invention will be described in detail with reference to the drawings FIG. 1A to FIG. 3B. FIG. 1A and FIG. 1B are cross-sectional views illustrating a MOS transistor according to the present embodiment. FIG. 2A and FIG. 2B are graphs showing the ESD robustness of the MOS transistor according to the present embodiment. FIG. 3A and FIG. 3B are diagrams showing how the MOS transistor according to the present embodiment is used.

As shown in FIG. 1A, N channel type MOS transistor (hereinafter, referred to as N-MOS) 1 includes, in its element, a protection structure against overvoltage such as ESD. As shown in FIG. 1A, N type epitaxial layer 3 is formed on P type single-crystal silicon substrate 2. Note that, although a single epitaxial layer 3 is formed on the substrate 2 in the present embodiment, the structure is not limited to this. For example, multiple epitaxial layers may be formed on the substrate. Moreover, the epitaxial layer 3 is sectioned into multiple element formation regions by isolation regions 4. Each of the isolation regions 4 is formed of P type buried layer 4A and P type diffusion layer 4B. It is noted that conductivity types such as N+, N and N− belong in one general conductivity type, and conductivity types such as P+, P and P− belong in the other general conductivity type.

The diffusion depth of the diffusion layer 4B from the top face of the epitaxial layer 3 (creep-down length) is shallower than the diffusion depth of the buried layer 4A from the top face of the substrate 2 (creep-up length). Accordingly, the formation regions of the isolation regions 4 can be made compact.

N type buried layer 5 is formed in a region extending into both regions of the substrate 2 and the epitaxial layer 3. P type diffusion layer 6 is formed in the epitaxial layer 3, and is used as a backgate region of the N-MOS 1. P type diffusion layer 7 is formed in the P type diffusion layer 6 by being superimposed thereon, and is used as a backgate lead region of the N-MOS 1.

N type diffusion layer 8 is formed in the diffusion layer 6, and is used as a source region of the N-MOS 1. N type diffusion layer 9 is formed in the epitaxial layer 3, and is used as a drain region of the N-MOS 1. N type diffusion layer 10 is formed in the N type diffusion layer 9 by being superimposed thereon, and is used as a drain lead region of the N-MOS 1.

Gate electrode 11 is formed on silicon oxide film 12 serving as a gate oxide film. The gate electrode 11 is made of, for example, a polysilicon film, and insulating spacer film 13 is formed on a side wall of the gate electrode 11. The insulating spacer film 13 is made of for example, an insulating film such as a silicon oxide film.

P type diffusion layer 14 is formed by being superimposed on the N type diffusion layers 9 and 10 which serve as the drain region. The P type diffusion layer 14 is located between the source region and the drain region of the N-MOS 1, closer to the P type diffusion layer 6 serving as the backgate region than contact hole 26 (see FIG. 7).

For example, the P type diffusion layer 14 is located below an end portion of the gate electrode 11 and the insulating spacer film 13, and is formed in the top face side of the N type diffusion layer 9. The impurity concentration of the P type diffusion layer 14 is higher than that of the N type diffusion layer 9, and is lower than that of the N type diffusion layer 10. The P type diffusion layer 14 is used as a floating diffusion layer, and is capacity coupled with a drain electrode and a drain wiring layer which are disposed above the P type diffusion layer 14.

As shown in a bold line in FIG. 1B, PN junction region 15 formed of the N type diffusion layer 10 and the P type diffusion layer 14 is formed in the drain region of the N-MOS 1. For example, the impurity concentration of the N type epitaxial layer 3 is $1.0 \times 10^{15}$ (/cm$^2$), the impurity concentration of the P type diffusion layer 6 is $1.0 \times 10^{17}$ to $1.0 \times 10^{18}$ (/cm$^2$), the impurity concentration of the P type diffusion layer 14 is $1.0 \times 10^{17}$ (/cm$^2$), and the impurity concentration of the N type diffusion layer 10 is $1.0 \times 10^{20}$). According to this structure, the junction withstand voltage of the PN junction region 15 is smaller than that of PN junction region 16 formed between the source region and the drain region of the N-MOS 1. In a case where overvoltage such as a positive ESD surge, for example, is applied to the drain electrode of the N-MOS 1, the PN junction region 15 breaks down before the PN junction region 16. Thus, this structure protects the N-MOS 1 from overvoltage.

Here, parasitic transistor Tr1 (hereinafter, referred to as parasite Tr1) exists inside the N-MOS 1. Specifically, the parasite Tr1 includes the N type diffusion layer 8 serving as an emitter region, the P type diffusion layers 6 and 7 serving as a base region, and the N type diffusion layers 9 and 10 (including the N type epitaxial layer 3) serving as a collector region. When a positive ESD surge (overvoltage) is applied to drain electrode 28 (see FIG. 7) of the N-MOS 1, the PN junction region 15 breaks down and holes are injected from the P type diffusion layer 14 into the N type diffusion layer 9, and then into the N type epitaxial layer 3. As a result, on-current I1 of the parasite Tr1 occurs as shown in a dotted arrow in FIG. 1B. The on-current I1 of the parasite Tr1 flows into the P type diffusion layer 6, thereby causing an increase in the potential of the base region of the parasite Tr1, and the parasite Tr1 is turned on. When the parasite Tr1 is turned on, conductivity modulation occurs in the collector region of the parasite Tr1, and the resistance value is greatly reduced. Thus, the current capacity is improved.

Meanwhile, since the on-current I1 of the parasite Tr1 is a high current, flow of such high on-current I1 may possibly cause heat breakdown of the N-MOS 1. To counter this problem, the P type diffusion layer 14 is disposed at a side face of the N type diffusion layer 10 formed between the source region and the drain region of the N-MOS 1 in this embodiment. The on-current I1 of the parasite Tr1 flows through the bottom face of the N type diffusion layer 10 into the epitaxial layer 3, and then into the P type diffusion layer 6 from a deep portion of the epitaxial layer 3. According to this structure in which the P type diffusion layer 14 is disposed as such, the on-current I1 of the parasite Tr1 takes a path avoiding a portion in the epitaxial layer 3 near its top surface (called a top surface portion of the epitaxial layer below), below the gate electrode 11 and the insulating spacer film 13, as shown in oval 17 in FIG. 1B. As a result, the on-current I1 of the parasite Tr1 flows through the deep portion of the epitaxial layer 3 which is excellent in thermal conductivity. Thus, a heat radiation region excellent in thermal conductivity is increased, and the heat breakdown of the N-MOS 1 is prevented.

Particularly, a region shown in the oval 17 is a region into which the on-current I1 of the parasite Tr1 being a high current flows if the P type diffusion layer 14 is not disposed, and is a region which requires a countermeasure against heat breakdown. This is because the silicon (epitaxial layer) has a higher thermal conductivity than the insulating layer (silicon oxide film or like), and the heat radiating property in the top surface portion of the epitaxial layer 3 is deteriorated due to the silicon oxide film 12 and the like. In other words, the deep portion of the epitaxial layer 3 is completely surrounded by the epitaxial layer 3 having a higher thermal conductivity, and thus is a region having higher heat radiating property than the top surface portion of the epitaxial layer 3.

In the N-MOS 1, a channel region is formed in a portion of the P type diffusion layer 6 near its top surface below the gate electrode 11, and a main current of the N-MOS 1 flows through the top surface portion of the epitaxial layer 3. In the drain region, the main current of the N-MOS 1 by-passes the p type diffusion layer 14, and flows into the drain electrode. However, by disposing the N type diffusion layer 9 around the P type diffusion layer 14, more beneficial advantages are obtained which include more moderate increase of resistance value and prevention of heat breakdown by the on-current I1 of the parasite Tr1. Moreover, concentration of an electric field is a problem in an end portion of the gate electrode 11 on the drain region side. However, this electric field can be made more moderate by disposing the N type diffusion layer 9 being a low concentration region.

Figure 9:
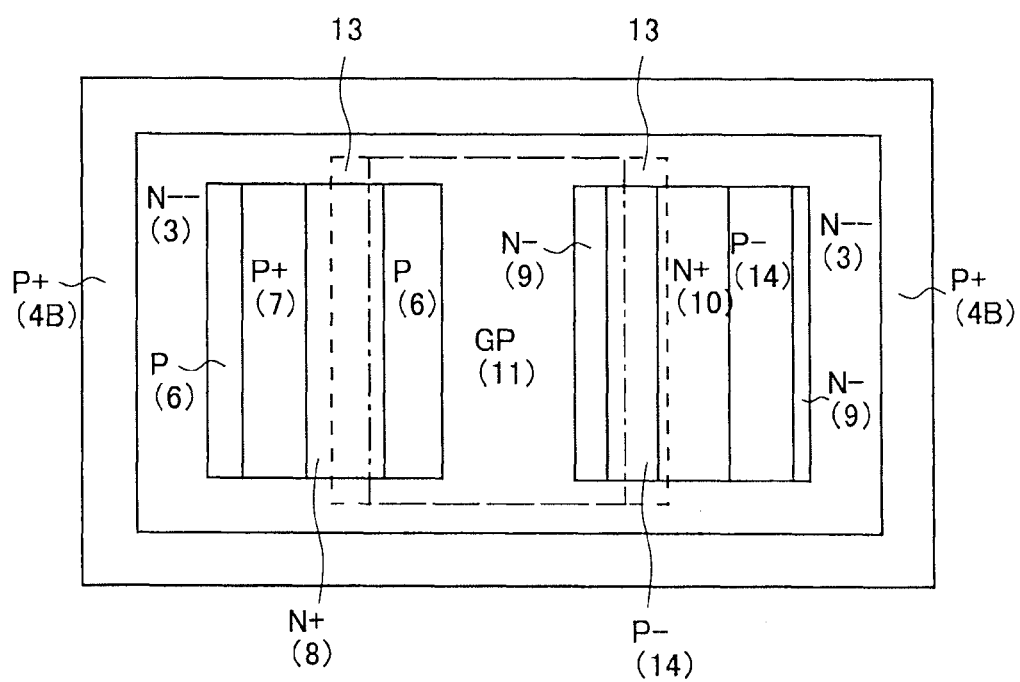
FIG. 9 is a plan view of the device shown in FIGS. 1A and 1B.

FIG. 9 shows this device in plan view. The solid lines correspond to the boundaries between diffusion layers, the unevenly broken line shows the gate electrode (GP) 11, and the evenly broken line shows the insulating spacer film 13. The P type diffusion layer 4B surrounds the diffusion layers that are aligned in one direction. The LOCOS oxide film is omitted in this plan view.

Specifically, in FIG. 2A, a solid line represents the present embodiment which includes the P type diffusion layer 14, and a dotted line represents a conventional embodiment which does not include the P type diffusion layer 14. Note that element structures other than the P type diffusion layer 14, and experiment conditions are the same in the present embodiment and the conventional embodiment. Descriptions are made by using the structure shown in FIG. 1B as needed.

In the present embodiment, a breakdown current occurs, for example, when an electrostatic breakdown voltage of approximately 9.0 V is applied, as shown in the solid line of FIG. 2A. Then, with the electrostatic breakdown voltage fixed within a range of approximately 9 V to 10 V, a breakdown current rises almost vertically. On the other hand, in the conventional embodiment, a breakdown current occurs, for example, when an electrostatic breakdown voltage of approximately 11 V is applied, and thereafter a snapback phenomenon occurs.

In the N-MOS 1 represented by the solid line, the P type diffusion layer 14 prevents expansion of a depletion layer expanding from the PN junction region 15 thereby lowering the electrostatic breakdown voltage (breakdown voltage). In the N-MOS 1 represented by the solid line, since the electrostatic breakdown voltage is lowered, the quantity of holes generated from the P type diffusion layer 14 is not sufficient enough to allow a high current to flow to the parasite Tr1. As a result, since a high voltage is required to allow flowing of the breakdown current (on-current I1 of the parasite Tr1), the above described rising phenomenon is observed. On the other hand, in the structure represented by the dotted line, the PN junction region 15 is not formed, and the electrostatic breakdown voltage (breakdown voltage) is higher due to the PN junction region 16. Here, the breakdown current (on-current I1 of the parasite Tr1) occurring is also high, thereby generating a larger quantity of holes. As a result, the holes generated flow into the P type diffusion layer 6 thereby turning on the parasite Tr1, and the snapback phenomenon occurs.

As is apparent from the results of these experiments, in the N-MOS 1 of the present embodiment, the PN junction region 15 can break down at a low voltage by the formation of the P type diffusion layer 14. As a result, the current amount of the on-current I1 of the parasite Tr1 can be made low, and a structure is achieved in which heat breakdown due to the on-current I1 of the parasite Tr1 is less likely to occur. In addition, a protection element can be formed by using the structure of the N-MOS 1 as shown in FIG. 3B described later. In this case, since the breakdown voltage of the protection element is fixed within a certain range, such as approximately 9 V to 10 V, the protection voltage of a protected element can be set more easily. Additionally, the protected element can be securely protected from overvoltage such as ESD.

Figure 2C:
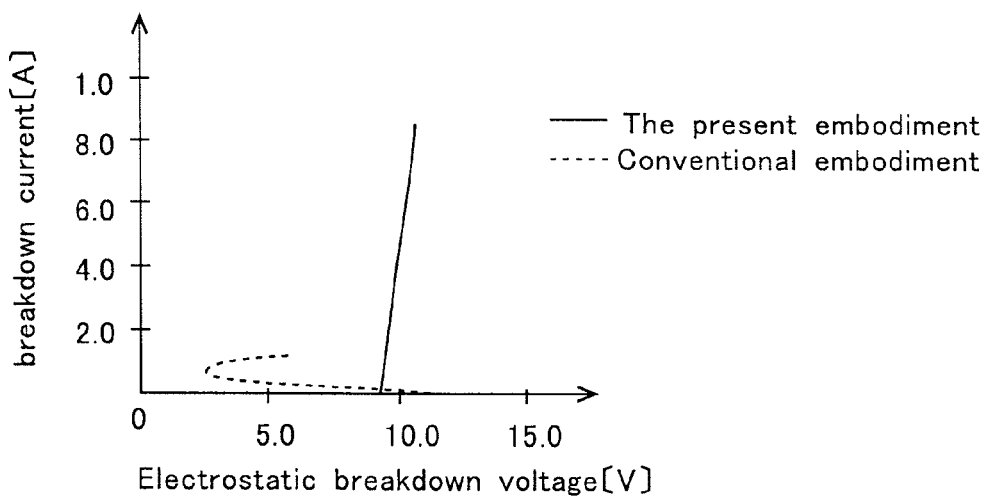
Figure 3A:
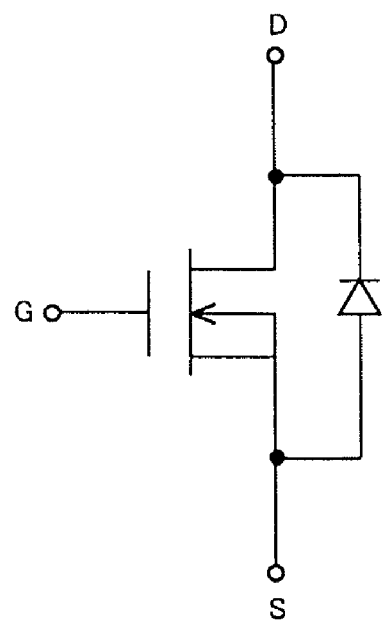
FIG. 3A and FIG. 3B are circuit diagrams illustrating the semiconductor device according to the embodiment of the present invention.
Figure 3B:
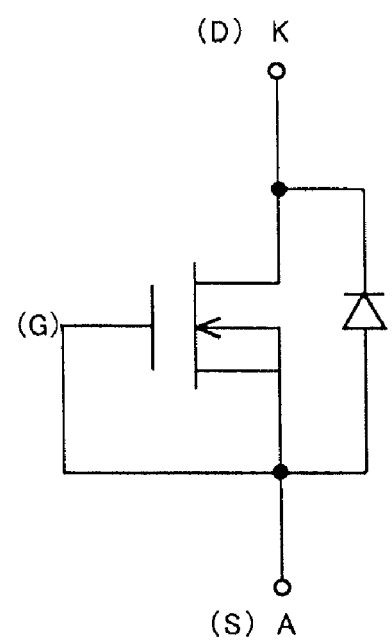

As in FIGS. 2A-2C, a solid line represents the present embodiment which includes the P type diffusion layer 14, and a dotted line represents the conventional embodiment which does not include the P type diffusion layer 14. Note that element structures other than the P type diffusion layer 14, and experiment conditions are the same in the present embodiment and the conventional embodiment.

In the present embodiment, an element temperature rises gradually until the current flowing between the source region and the drain region reaches 0.6 A, as represented in the solid line. Thereafter, at a point where the drain current rises to 0.7 A, the rise in the element temperature becomes significant, and the element temperature reaches approximately 1300 K. On the other hand, in the conventional embodiment, an element temperature rises gradually also until the current flowing between the source region and the drain region reaches 0.4 A, as represented in the dotted line. Thereafter, at a point where the drain current rises to 0.6 A, the rise in the element temperature becomes significant, and the element temperature reaches approximately 1700 K.

As is also apparent from the results of these experiments, since the P type diffusion layer 14 is formed to make the deep portion of the epitaxial layer 3 serve as the current pass, heat radiation property in the element improves, achieving a structure capable of easily preventing heat breakdown due to a current.

As shown in FIG. 3A, the N-MOS 1 of the present embodiment includes the PN junction region 15 for protection from overvoltage. Normally, in the N-MOS 1, the main current flows between the source region and the drain region. The structure has been described, for example, in which, when a positive ESD surge is applied to the drain electrode, the on-current I1 of the parasite Tr1 flows through the deep portion of the epitaxial layer 3 from the drain electrode side to the source electrode side thereby protecting the N-MOS 1. However, the present invention is not limited to this structure. For example, the gate electrode and the source electrode of the N-MOS 1 may be short-circuited to be used as a protection diode as shown in FIG. 3B. In this structure, a protected element can be protected from overvoltage such as a positive ESD surge by connecting the protection diode and the protected element by wiring.

Description has been made of the N-MOS 1 above. However, similar effects can be also obtained in a P channel type MOS transistor (hereinafter, referred to as a P-MOS) by including, in its element, a structure which protects the P-MOS from overvoltage such as ESD. Specifically, also in a drain region of the P-MOS, an N type diffusion layer is disposed between a source region and the drain region, thereby forming a PN junction region.

According to this structure, an on-current of parasite Tr flows through a route avoiding the top surface portion of an epitaxial layer. This protects the P-MOS from heat breakdown due to the on-current of the parasite Tr being a high current.

Moreover, described above is a case where the N type epitaxial layer 3 is formed on the top face of the P type substrate 2, and then the N-MOS 1 is formed in the N type epitaxial layer 3. However, the invention is not limited to this structure. For example, the N-MOS 1 may be formed in an N type diffusion layer formed in the P type substrate 2. This is similar in the case of the P-MOS. In addition, various modifications are possible within a scope not departing from the gist of the invention.

Next, a method of manufacturing a semiconductor device, which is a second embodiment of the present invention, will be described in detail with reference to FIG. 4 to FIG. 7. FIG. 4 to FIG. 7 are cross-sectional views for describing the manufacturing method of a semiconductor device according to the present embodiment. Note that, in the descriptions below, components which are the same as the components of the N channel type MOS transistor 1 (hereinafter, referred to as N-MOS 1) shown in FIG. 1 are denoted with the same reference numeral.

Figure 4:
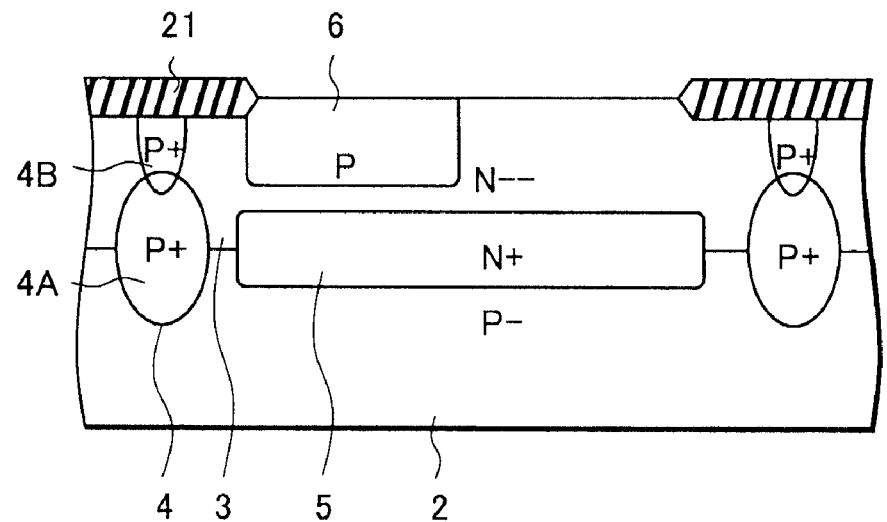
FIG. 4 is a cross-sectional view illustrating a method of manufacturing a semiconductor device according to another embodiment of the present invention.

Firstly, as shown in FIG. 4, P type single-crystal silicon substrate 2 is prepared, and then N type epitaxial layer 3 is formed on the substrate 2. Thereafter, P type buried layer 4A constituting isolation regions 4 and N type buried layer 5 are formed in the substrate 2 and the epitaxial layer 3. In addition, P type diffusion layer 4B constituting the isolation regions 4 and P type diffusion layer 6 to be a backgate region of the N-MOS 1 are formed in the epitaxial layer 3. LOCOS oxide film 21 is formed in a certain region of the epitaxial layer 3.

Figure 5:
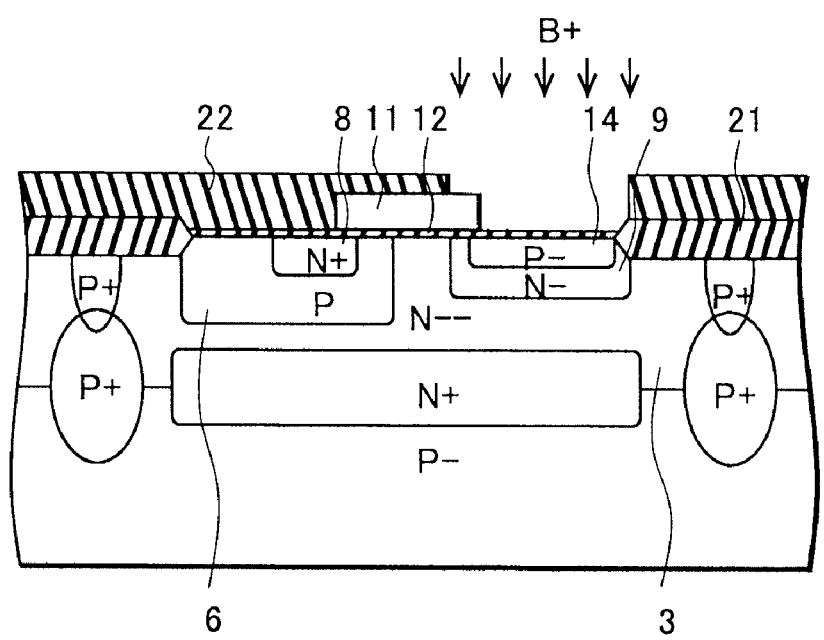
FIG. 5 is a cross-sectional view illustrating the method of manufacturing a semiconductor device according to the embodiment of the present invention.

Next, as shown in FIG. 5, silicon oxide film 12 is formed on the epitaxial layer 3. Then, using a photoresist (not shown), N type impurity, for example phosphorous (P), is ion-implanted from the surface of the epitaxial layer 3 at an accelerating voltage of 30 to 300 (keV) and at an introduction amount of $1.0 \times 10^{12}$ to $1.0 \times 10^{14}$ (/cm$^2$). Then, after removing the photoresist, heat treatment is applied and N type diffusion layer 9 is formed. Thereafter, a polysilicon film is formed on the silicon oxide film 12, and is selectively removed to form gate electrode 11. Then, N type diffusion layer 8 to be a source region of the N-MOS 1 is formed while using the gate electrode 11 as a part of a mask. Next, photoresist 22 is formed on the silicon oxide film 12, and an opening is formed in the photoresist 22 above a region where P type diffusion layer 14 is to be formed. Then, P type impurity, for example boron (B), is ion-implanted from the surface of the epitaxial layer 3 at an accelerating voltage of 30 to 100 (keV) and at an introduction amount of $1.0 \times 10^{13}$ to $1.0 \times 10^{15}$ (/cm$^2$). Here, a self alignment technique using the gate electrode 11 is employed when performing the ion-implantation so that the P type diffusion layer 14 is formed accurately at a certain position with respect to the gate electrode 11. Note that the P type diffusion layer 14 is formed in a superimposed manner on the N type diffusion layer 9. Here, to make the superimposed region a part of the P type diffusion layer 14, the P type diffusion layer 14 is formed as a region having a higher concentration of impurity than the N type diffusion layer 9.

Figure 6:
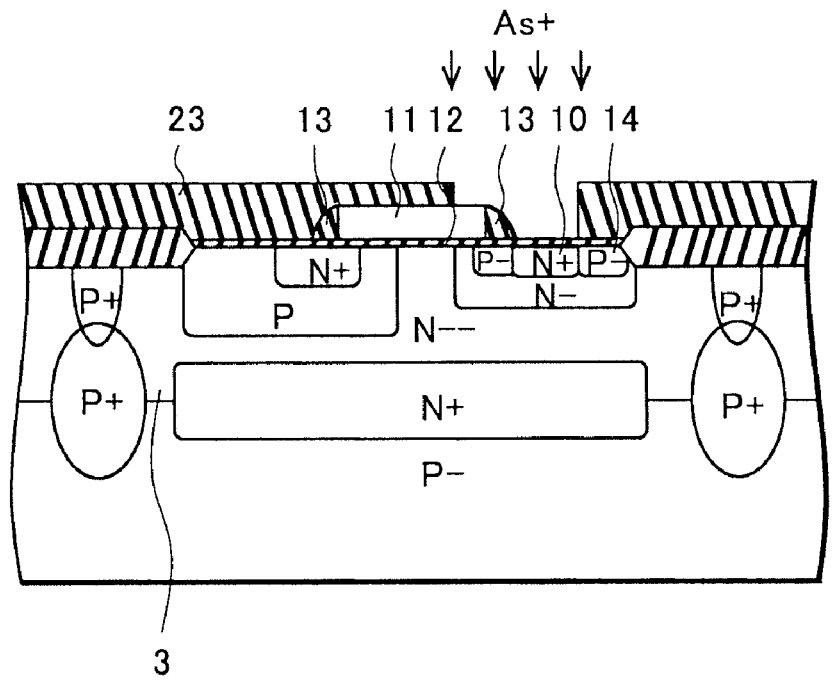
FIG. 6 is a cross-sectional view illustrating the method of manufacturing a semiconductor device according to the embodiment of the present invention.

Next, as shown in FIG. 6, after the photoresist 22 is removed (see FIG. 5) and heat treatment is applied, a silicon oxide film is deposited on the epitaxial layer 3 by, for example, a CVD method. Thereafter, the silicon oxide film is etched back to form insulating spacer film 13 on a side wall of the gate electrode 11. Then, photoresist 23 is formed on the silicon oxide film 12, and an opening is formed in the photoresist 23 above a region where N type diffusion layer 10 is to be formed. Thereafter, N type impurity, for example arsenic (As), is ion-implanted from the surface of the epitaxial layer 3 at an accelerating voltage of 30 to 200 (keV) and at an introduction amount of $1.0 \times 10^{16}$ to $1.0 \times 10^{17}$ (/cm$^2$). Here, a self alignment technique using the insulating spacer film 13 is employed when performing the ion-implantation so that the N type diffusion layer 10 is formed accurately at a certain position with respect to the insulating spacer film 13. According to this manufacturing method, when drain electrode 28 (see FIG. 7) is connected to the N type diffusion layer 10, a clearance distance between the gate electrode 11 and the drain electrode 28 can be made as small as possible thereby reducing the element size of the N-MOS 1. Note that the N type diffusion layer 10 is formed in a superimposed manner on the P type diffusion layer 14. Here, to make the superimposed region a part of the N type diffusion layer 10, the N type diffusion layer 10 is formed as a region having a higher concentration of impurity than the P type diffusion layer 14.

According to this manufacturing method, the P type diffusion layer 14 is disposed accurately in a certain position below the gate electrode 11 and the insulating spacer film 13 without making a consideration of a mask deviation amount when the P type diffusion layer 14 and N type diffusion layer 10 are formed. Accordingly, in the drain region of the N-MOS 1, a PN junction region is formed between the source region and the drain region without increasing the element size of the N-MOS 1, and the effects described in the first embodiment can be obtained.

Figure 7:
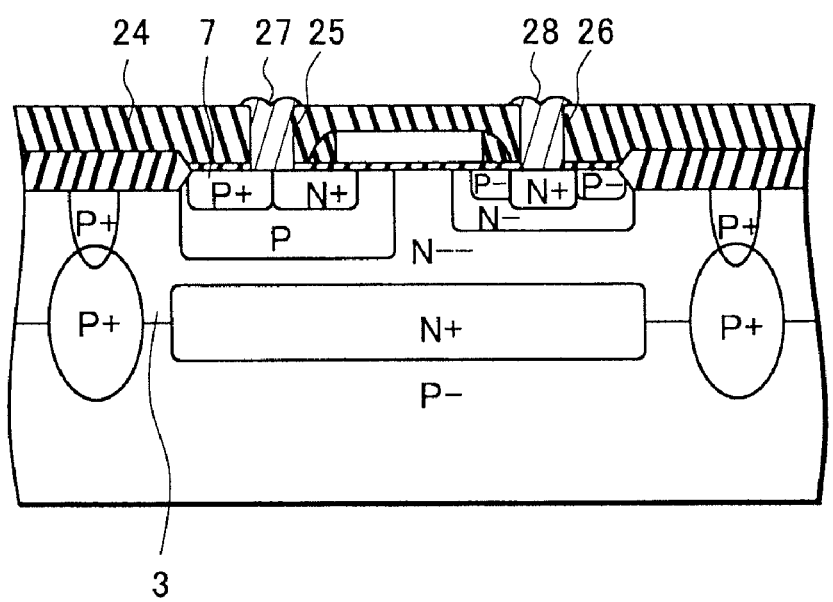
FIG. 7 is a cross-sectional view illustrating the method of manufacturing a semiconductor device according to the embodiment of the present invention.
Figure 8:
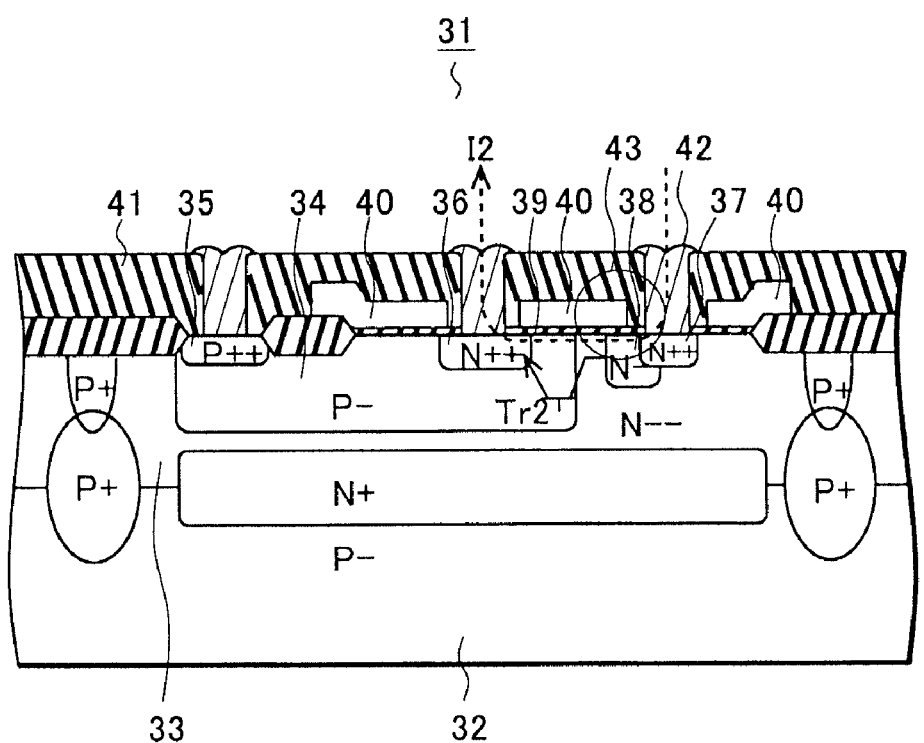
FIG. 8 is a cross-sectional view illustrating a semiconductor device according to a conventional embodiment.

Lastly, as shown in FIG. 7, P type diffusion layer 7 is formed in the epitaxial layer 3, and then insulating layer 24 is formed on the epitaxial layer 3. The insulating layer 24 may be formed by stacking a TEOS (Tetra-Ethyl-Ortho-Silicate) film, a BPSG (Boron phospho Silicate Glass) film, a SOG (Spin On Glass) film and the like. Then, contact holes 25 and 26 are formed in the insulating layer 24, and source electrode 27 and drain electrode 28 are respectively formed in the contact holes 25 and 26.

In the present embodiment, the N type diffusion layer 10 and the P type diffusion layer 14 are formed accurately at the respective positions by using the insulating spacer film 13 and the gate electrode 11, respectively. However, the present invention is not limited to this method. Here, it is only required that, in the drain region of the N-MOS 1, the P type diffusion layer 14 should be disposed in a current path between the source region and the drain region, and that PN junction region 15 (see FIG. 1A) should be formed. The manufacturing method can be modified as desired. In addition, various modifications are possible within a scope not departing from the gist of the invention.

What is claimed is:

1. A semiconductor transistor device comprising:
    a semiconductor layer of a first general conductivity type;
    a drain diffusion layer of the first general conductivity type formed in the semiconductor layer, the drain diffusion layer comprising a drain contact region configured to receive a drain potential from a device external to the transistor device or supply a drain potential to a device external to the transistor device;
    a backgate diffusion layer of a second general conductivity type formed in the semiconductor layer;
    a source diffusion layer of the first general conductivity type formed in the backgate diffusion layer; and
    an additional diffusion layer of the second general conductivity type formed in the drain diffusion layer so that at least part of the additional diffusion layer is disposed between the backgate diffusion layer and the drain contact region,
    wherein a sidewall of the additional diffusion layer and a sidewall of the drain contact region are in direct contact so as to form a PN junction, and the PN junction is configured to break down upon receiving a surge voltage at the drain contact region.

2. The semiconductor transistor device of claim 1, wherein the additional drain diffusion layer has an impurity concentration higher than the drain diffusion layer, the drain contact region is part of a drain lead region of the first general conductivity type formed in the drain diffusion layer and having an impurity concentration higher than the drain diffusion layer, and part of the additional diffusion layer is disposed between the backgate diffusion layer and the drain lead region.

3. The semiconductor transistor device of claim 1, further comprising a gate electrode formed on the semiconductor layer and an insulating spacer film formed on a side wall of the gate electrode, wherein the additional diffusion layer is disposed below the insulating spacer film and an end portion of the gate electrode, and the gate electrode overlaps the drain diffusion layer at least partially.

4. The semiconductor transistor device of claim 1, further comprising a semiconductor substrate of the second general conductivity type on which the semiconductor layer is formed.

5. A method of manufacturing a semiconductor device, comprising:
   in a semiconductor layer, forming a drain diffusion layer of a first general conductivity type, a backgate diffusion layer of a second general conductivity type and a source diffusion layer of the first general conductivity type, the drain diffusion layer comprising a drain contact region;
   forming a gate electrode on the semiconductor layer;
   forming an additional diffusion layer of the second general conductivity type in the drain diffusion layer using the gate electrode as a part of a mask; and
   after the formation of the additional diffusion layer, forming an insulating spacer film on a side wall of the gate electrode,
   wherein the additional diffusion layer is formed such that a sidewall of the additional diffusion layer and a sidewall of the drain contact region are in direct contact so as to form a PN junction, and that the PN junction is configured to break down upon receiving a surge voltage at the drain contact region.

6. The method of claim 5, further comprising forming a drain lead region of the first general conductivity type in the drain diffusion layer so as to have an impurity concentration higher than the drain diffusion layer using the insulating spacer film as a part of a mask.

* * * * *